US007956640B2

(12) United States Patent
Gupta et al.

(10) Patent No.: US 7,956,640 B2
(45) Date of Patent: Jun. 7, 2011

(54) DIGITAL RADIO FREQUENCY SWITCH MATRIX

(75) Inventors: Deepnarayan Gupta, Hawthorne, NY (US); Alexander F. Kirichenko, Elmsford, NY (US)

(73) Assignee: Hypres, Inc., Elmsford, NY (US)

( * ) Notice: Subject to any disclaimer, the term of this patent is extended or adjusted under 35 U.S.C. 154(b) by 829 days.

(21) Appl. No.: 11/966,918

(22) Filed: Dec. 28, 2007

(65) Prior Publication Data

US 2008/0101444 A1    May 1, 2008

Related U.S. Application Data

(63) Continuation of application No. 11/424,121, filed on Jun. 14, 2006, now Pat. No. 7,362,125, and a continuation of application No. 11/360,749, filed on Feb. 23, 2006, now Pat. No. 7,443,719, and a continuation of application No. 11/243,020, filed on Oct. 4, 2005, now Pat. No. 7,508,230, and a continuation of application No. 11/243,022, filed on Oct. 4, 2005, now abandoned, and a continuation of application No. 11/243,019, filed on Oct. 4, 2005, now Pat. No. 7,680,474.

(51) Int. Cl.
*H03K 19/177* (2006.01)
(52) U.S. Cl. ........................................... 326/39; 326/93
(58) Field of Classification Search .................. 326/1–7, 326/37–39, 46, 93
See application file for complete search history.

(56) References Cited

U.S. PATENT DOCUMENTS

| | | | | |
|---|---|---|---|---|
| 6,865,639 | B2 * | 3/2005 | Herr | 710/317 |
| 6,917,537 | B2 | 7/2005 | Bunyk | |
| 6,960,929 | B2 * | 11/2005 | Bedard | 326/1 |

OTHER PUBLICATIONS

Hashimoto, et al., "Implementation of a 4×4 Switch with Passive Interconnects", IEEE Trans. Appl. Supercon., vol. 15, No. 2, Jun. 2005, pp. 356-359.
Brock, et al., "Superconductor Digital Development for Software Radio", IEEE Commun, Mag., pp. 174-179, Feb. 2001.
Likharev, et al., "RSFQ Logic/Memory Family: A new Josephson junction technology for sub-THz digital systems", IEEE Trans. Appl. Supercond., vol. 1, pp. 3-28, 1991.

* cited by examiner

*Primary Examiner* — Don P Le
(74) *Attorney, Agent, or Firm* — Steven M. Hoffberg; Ostrolenk Faber LLP

(57) ABSTRACT

A digital radio frequency switch system and method, adapted to receive a plurality of inputs, generate a plurality of outputs, and simultaneously route a plurality of inputs to any of a plurality of outputs, comprising an array comprising a plurality of inputs, having a plurality of associated clocks; a digital control input adapted to receive a signal indicative of a mapping between at least one of said inputs and at least one respective output; a digital logic array, responsive to said digital control input for simultaneously communicating a plurality of signals each corresponding to one of the plurality of inputs and a respective associated clock to at least one of said outputs indicated by the digital control input; and an array of the outputs, each adapted to present a regenerated signal corresponding to one of the plurality of inputs and a respective associated synchronized regenerated clock maintaining accurate relative timing therebetween.

24 Claims, 9 Drawing Sheets

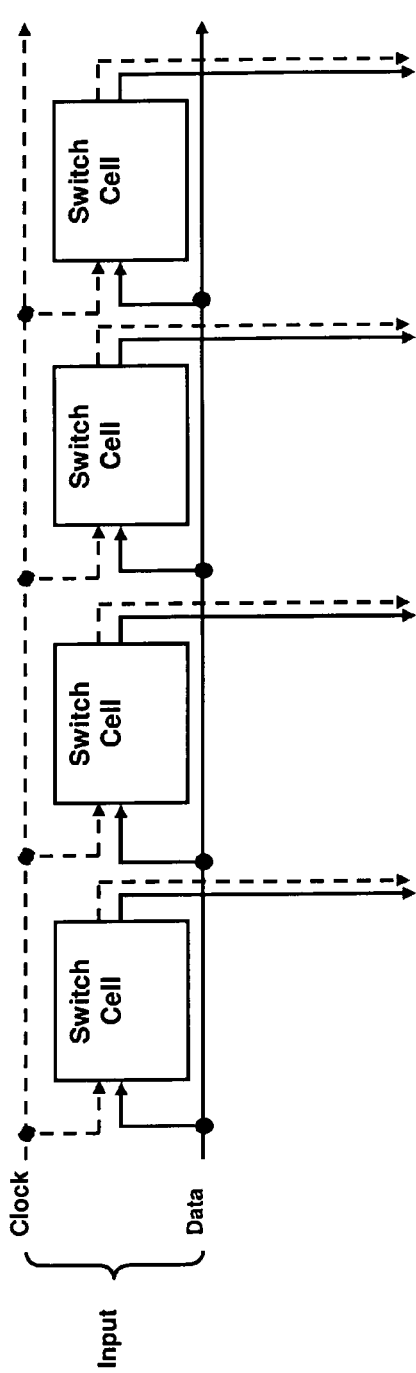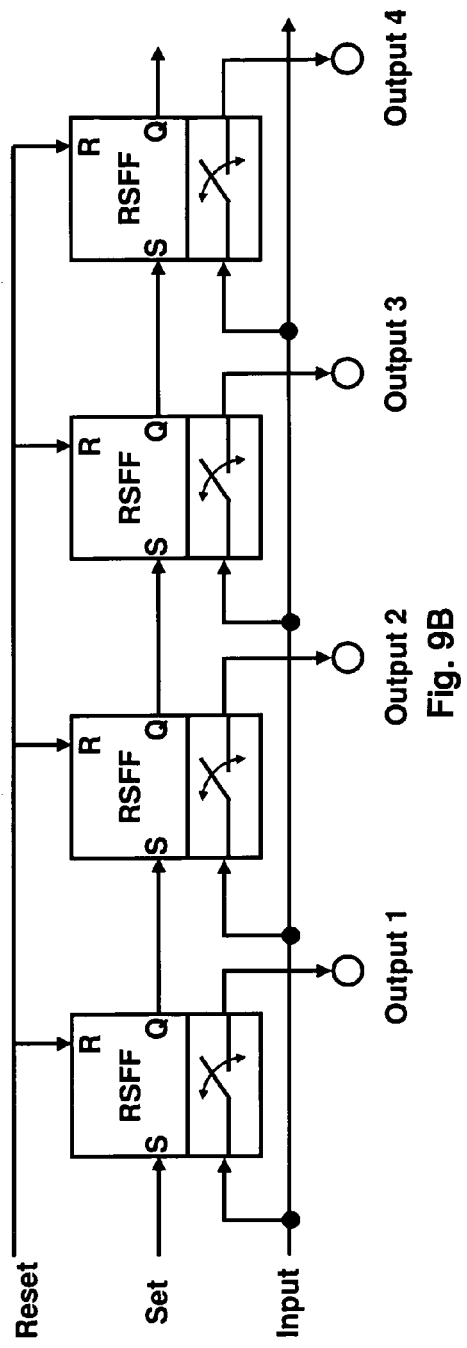
Fig. 9A
Fig. 9B

DIGITAL RADIO FREQUENCY SWITCH MATRIX

CROSS REFERENCE TO RELATED APPLICATIONS

This application is related to and claims priority to the following applications: (1) U.S. application Ser. No. 11/243,019, filed Oct. 5, 2005, by inventors Alexander Kirichenko, Deepnarayan Gupta, and Saad Sarwana entitled Superconducting Digital Mixer; (2) U.S. application Ser. No. 11/243,022, filed Oct. 5, 2005, by inventor Alexander Kirichenko entitled A Digital Programmable Frequency Divider; (3) U.S. application Ser. No. 11/243,020, filed Oct. 5, 2005, by inventor Alexander Kirichenko entitled A Digital Programmable Phase Generator; (4) U.S. application Ser. No. 11/360,749, filed Feb. 23, 2006, by inventors Alexander Kirichenko, Timur Filippov, and Deepnarayan Gupta entitled Superconducting Circuit for High-Speed Lookup Table; (5) U.S. application Ser. No. 11/424,121, filed Jun. 14, 2006, by inventors Deepnarayan Gupta and Alexander Kirichenko entitled Digital Routing Switch Matrix for Digitized Radio-Frequency Signals. Each of these applications is hereby incorporated by reference in its entirety.

BACKGROUND OF THE INVENTION

1. Field of the Invention

This invention relates to the field of switching circuits and, more particularly, for switching circuits for advanced digital radio receivers and transmitters.

2. Description of the Prior Art

A simple classic radio receiver consists of a single antenna coupled to a downconverter that extracts a single "baseband" channel. In a modern receiver, the baseband signal is digitized with an analog-to-digital converter (ADC) and further processed in the digital domain. A classic transmitter contains essentially the same components working in the reverse direction; a transceiver contains both a transmitter and a receiver packaged together.

A multi-band, multi-channel RF communications system (see FIG. 1a) can include multiple antennas, and can extract multiple baseband channels or groups of channels simultaneously. This requires a switch matrix, which permits distribution of various signals between each antenna (corresponding to each band) and one or more appropriate radio receiver channels. If the system is to be flexible and reconfigurable, it should be possible to redirect input signals to selected output channels.

The signal at the antenna is an analog waveform, even if it may be encoding a digital signal. In a conventional receiver system of the prior art, as illustrated in FIG. 1a, both the switch matrix and the channelizing receivers are analog components, and similarly for the transmitter. However, these band-specific precision analog components are often expensive and limited in their flexibility and reconfigurability. Furthermore, these analog switching systems have severe deficiencies in terms of losses, isolation, crosstalk, and ability to multicast.

For these reasons, the communications industry would like to move toward an approach known as "software-defined radio" (SDR) or "software radio", where all data processing is carried out in the digital domain, except right at the antenna itself. This requires ultrafast data converters, with sampling rates of tens of GHz and excellent linearity. ADCs with the requisite properties have recently been demonstrated, based on superconductor electronics using Josephson junctions, with circuit designs based on rapid-single-flux-quantum logic (RSFQ). It is natural that this data conversion be carried out right at the antenna, as illustrated in FIG. 1b. But in this case, the switching must also be carried out directly on the digital-RF signals. Furthermore, the precision and linearity of these signals can be maintained in the distribution network only if the sampling clock is distributed along with the data bits. This requires a new type of digital-RF switch matrix, which has not been reported before, and which is the subject of the present invention.

Furthermore, the digital-RF transceiver architecture allows natural partitioning between band-specific (analog) and band-independent (digital) components. Analog components, such as antennas and amplifiers are optimized for performance within a particular frequency band. Even data converters between analog and digital formats, ADCs and DACs, work best with designs that target specific frequency bands. Furthermore, an ADC or DAC optimized for a particular frequency band will typically have a particular sampling frequency (clock frequency $f_{clock}$) that is preferred for best performance. For example, a radio-frequency bandpass ADC designed for a center frequency f) may exhibit the greatest dynamic range for a sampling frequency that is four times the center frequency ($f_{clock}=4\times f$)). On the contrary, digital signal processing units, operating on numbers, are independent of the signal characteristics. This partitioning enables the true software radio paradigm by allowing full software programmability of the RF distribution network. Superconductor electronics are fast enough to digitize at multi-GHz RF and perform subsequent processing completely in the digital domain.

Switch matrices based on superconducting electronic circuits have been recently reported by several inventors. For example, see (1) U.S. Pat. No. 6,960,929, issued Nov. 1, 2005 by inventor Fernand D. Bedard, entitled Superconductive Crossbar Switch, (2) U.S. Pat. No. 6,917,537, issued Jul. 12, 2005 by inventor Paul I. Bunyk entitled RSFQ Batcher-Banyan Switching Network, (3) U.S. Pat. No. 6,865,639, issued Mar. 8, 2005 by inventor Quentin P. Herr entitled Scalable Self-Routing Superconductor Switch, and (4) Hashimoto et al., Implementation of a 4×4 Switch With Passive Interconnects, IEEE Trans. Appl. Supercon., vol 15, no. 2, June 2005, pp. 356-359.

However, none of these patents was designed for an application in RF communications, and none of these include switches which route the clock signal together with the data signal, which are two of several reasons this invention distinguishes over the prior art. See also the article by D. K. Brock, O. A. Mukhanov, and J. Rosa, "Superconductor Digital Development for Software Radio," IEEE Commun. Mag., pp. 174-179, February 2001, and K. K. Likharev and V. K. Semenov, "RSFQ Logic/memory Family: A new Josephson junction technology for sub-THz digital systems", IEEE Trans. Appl. Supercond., vol. 1, pp. 3-28, 1991.

Problems of the Prior Art

The prior art switches have been expensive and limited in their flexibility and ability to reconfigure. In addition, they have severe deficiencies in terms of losses, isolation, cross talk and ability to multicast.

It is natural and desirable that data conversion be carried out right at the antenna, but, in such a case, the switching must also be carried out directly on the digital-RF signals. Further, the precision and linearity of these signals can be maintained in the distribution network only if the sampling clock is distributed along with the data bits. This requires and new type of digital-RF switch matrix which is the subject of the present invention.

SUMMARY OF THE INVENTION

A multi-carrier, multi-channel RF communication system requires a switch matrix to route various signals between a set of antennas and a set of radio transceivers. This can be carried out most efficiently in the digital domain, but requires the use of ultrafast circuits that can accurately process multi-GHz RF signals.

One aspect of the invention is directed to a switch matrix which is suitable for routing various signals between a set of antennas and a set of radio transceivers. The transceivers can be multi-carrier, multi-channel RF communication devices. The routing is carried out in the digital domain and uses ultra fast superconductive circuits that can accurately process multi-gigahertz RF signals. For best performance the basic switching cell must carry both the data bits and the sampling clock, where the sampling clock may be at different frequencies for signals from different RF bands distributed within the same switch matrix.

Preferred exemplary embodiments of the invention are implemented using ultra fast RSFQ superconducting logic elements.

BRIEF DESCRIPTION OF THE DRAWINGS

FIGS. 9A and 9B show implementations of a multicasting switch using RSFQ cells, respectively with and without clock accompanying a data line.

DETAILED DESCRIPTION OF THE INVENTION

I. Basic Switching Cells

RSFQ logic, first developed by Likharev, Semenov, and Mukhanov, is built around Josephson junctions (JJs), with lossless propagation of single-flux-quantum (SFQ) voltage pulses, each corresponding to an integrated pulse of 2 mV-ps. Two different types of RSFQ switch cells are described, both of which are well known in the literature: the DC switch and the NDRO switch. In either case, the general principle of operation is the same. A JJ is biased such that an SFQ pulse will cause it to temporarily exceed its critical current and then return to its previous state, thus emitting another SFQ pulse. The switching time, which depends on the critical current density (Jc) of the JJ, is about 2 ps for the Jc=4.5 kA/cm$^2$. This ultrafast switching allows a very high rate (40 Gbps and higher) of SFQ digital signals. Whether or not a switch responds to an input SFQ pulse depends on its designed control conditions (DC bias, control current, or other concurrent digital events). For example, the state of the switch—whether it will pass or block a digital input—may be controlled by the state of a coupled flip-flop, where control information could be stored.

Figure 1A:
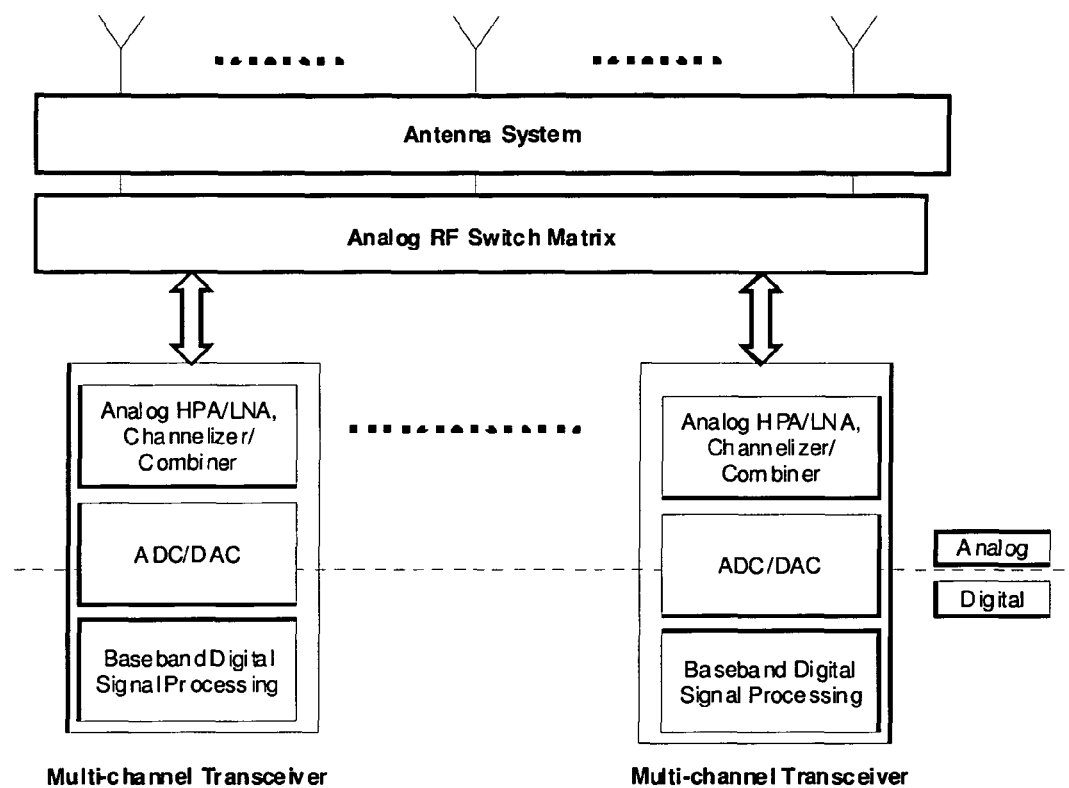
FIG. 1A is a block diagram of a multi-band, multi-channel RF transceiver system incorporating an analog switch matrix as known in the prior art.
Figure 1B:
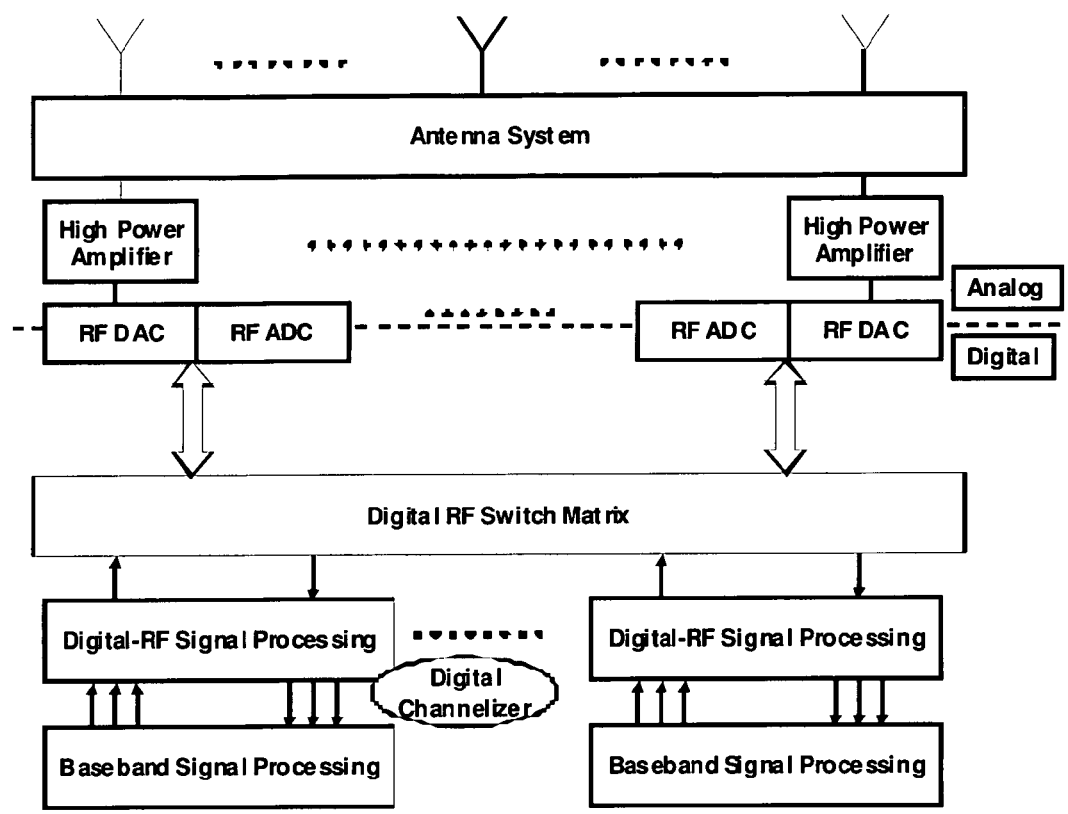
FIG. 1B is a block diagram of a multi-band, multi-channel RF transceiver system incorporating a new digital switch matrix for use with digital RF architectures in accordance with one aspect of the invention.
Figure 2:
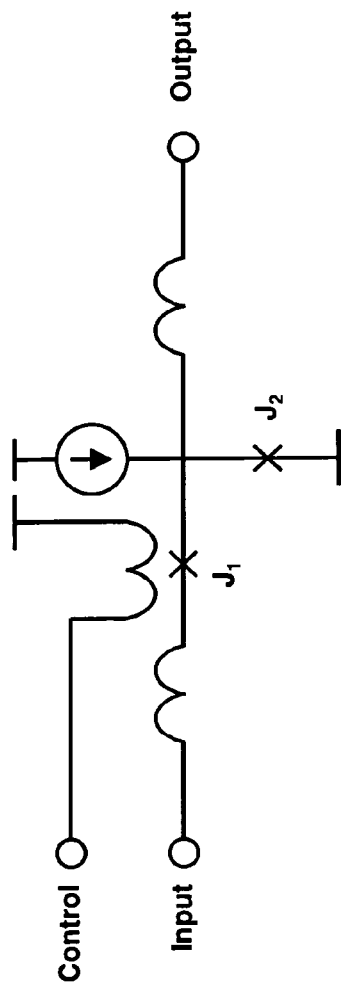
FIG. 2 shows a basic digital switch using Josephson junctions.

FIG. 2 shows a schematic diagram of a simple DC-switch with only 2 JJs, which is controlled by applying DC current to the control line.

Figure 3B:
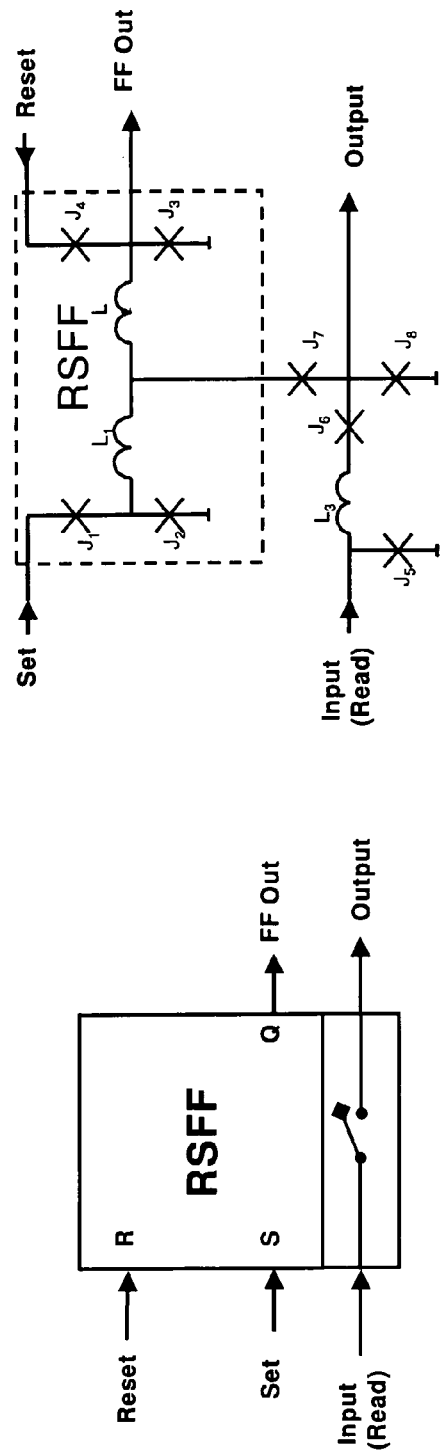
FIG. 3B is a schematic diagram of the digital switch based on a non-destructive readout (NDRO) cell.
Figure 3A:
FIG. 3A is a block diagram of a digital switch based on a non-destructive readout (NDRO) cell.

FIGS. 3A and 3B show another digital switch element, called a non-destructive readout (NDRO) switch, where the control information is stored in a reset-set flip-flop (RSFF). (The NDRO switch with 8 JJs is more complex for a single switch, but is more easily scalable to large switch matrices.) An SFQ pulse applied to the Set input sets the RSFF to the '1' state. While it is in the '1' state, any pulse applied to the input will be read out as an SFQ pulse at the output synchronized to the clock input. This corresponds to the 'ON' (closed) state of the switch.

If a pulse is applied to the Reset input, the RSFF is reset to the '0' state. While it is in the '0' state, any pulse applied to the input will escape through J6 and no SFQ pulse will be produced at the output. This corresponds to the 'OFF' (open) state of the switch. One advantage of this type of switch is that only one external control line is required for each cell to write the desired switch states for the entire matrix. Thus the control for the entire matrix can be stored as a serial digital word. This is achieved by simply connecting the RSFFs of different switch cells as a shift register by applying the FF Out to the Set input of the next RSFF.

One needs to route both data and clock from each input source through the switch to desired output ports, for fully asynchronous operation. Of course, this can be accomplished by two switch cells which are manually set (reset) together. However a more elegant solution is part of one aspect of the invention by routing the clock signal through an NDRO switch and controlling propagation of the data stream through an RSFF (see FIG. 4 where the clock line is shown as a dashed line), thus reducing the JJ count necessary.

Figure 4:
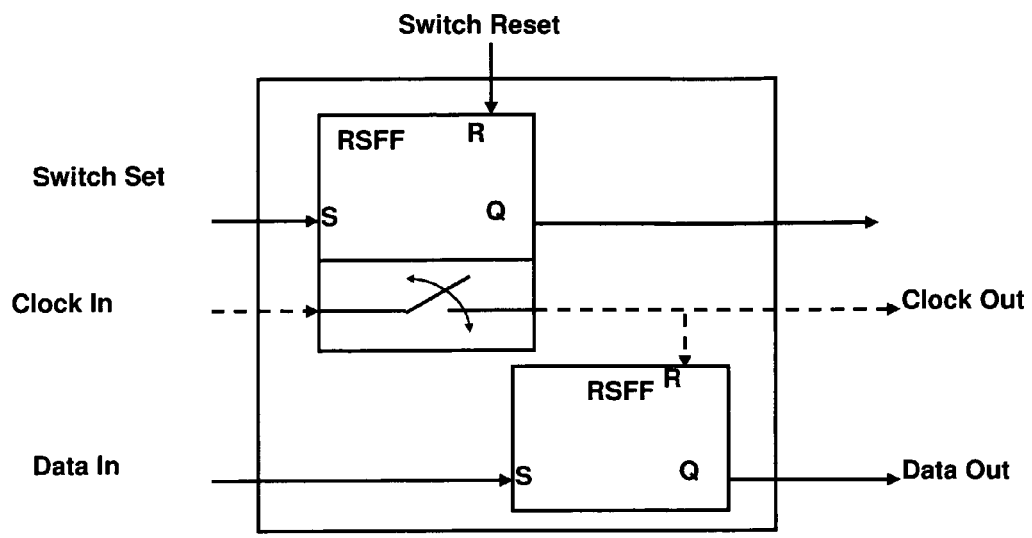
FIG. 4 is a novel switch cell for routing clock and data together.

FIG. 4 can be extended to accommodate a n-bit parallel data stream by replicating instance of the Data RSFF for each bit stream of the n-bit parallel data stream, with each RSFF being reset by the clock output signal.

II. Routing Switch Architecture

Figure 5:
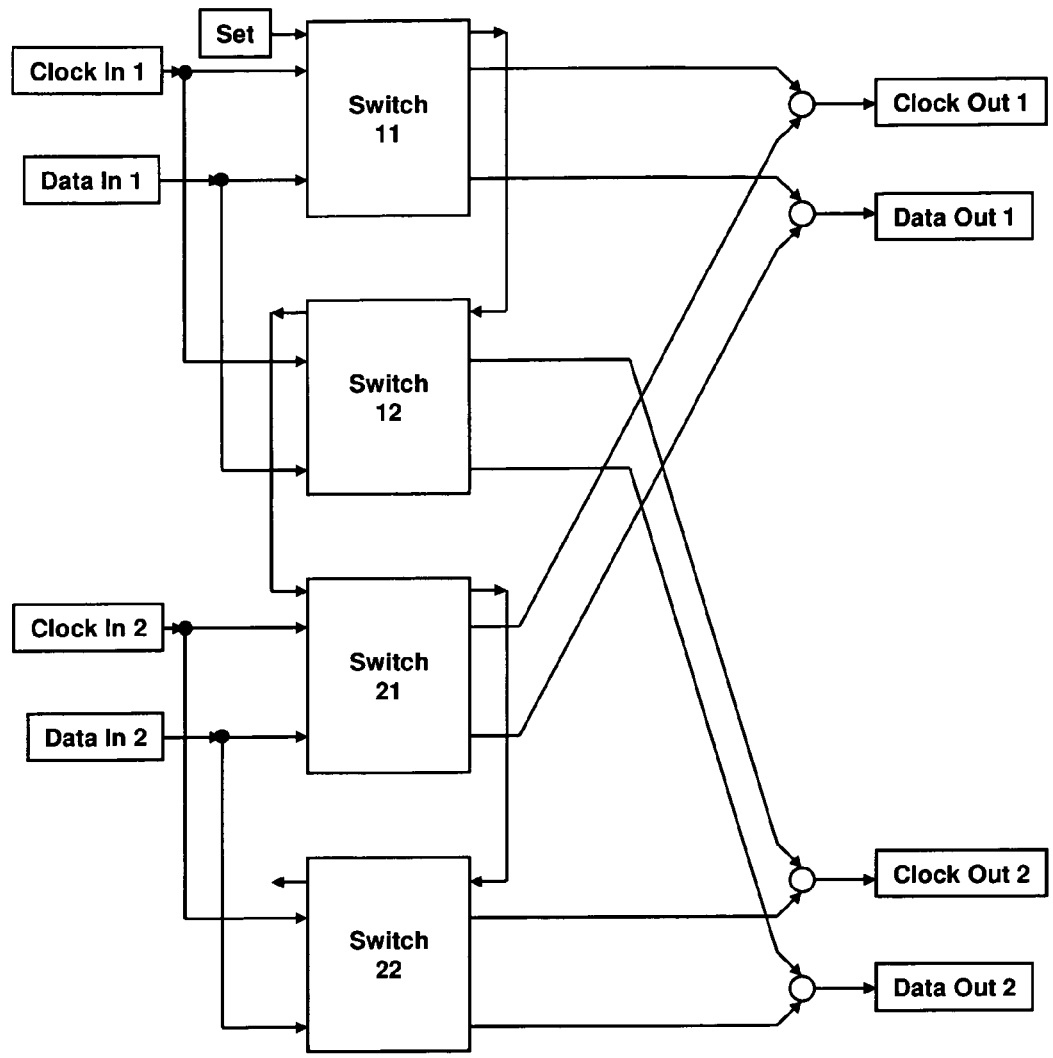
FIG. 5 is a block diagram of a 2×2 building-block for a 1:1 router matrix.

Consider a switch architecture where each input is routed only to a single output. (This constraint will be relaxed later.) To see how to scale up from a single switch, consider first a 2×2 building block (see FIG. 5). This is done with 4 switch cells. The data and clock signals from the first input are applied to Switch 11 and Switch 12 respectively, and the data and clock signals from the second input are applied to Switch 21 and Switch 22 respectively. The data and clock outputs from Switch 11 and Switch 21 are merged (combined) at the first output port, and the data and clock outputs from Switch 12 and Switch 22 are merged (combined) at the second output port. We have shown both clock and data paths, as well as the control (set) line, explicitly to illustrate the complexity of the design. We did not show the reset line, which will add to the routing complexity, but could be laid out similarly to the set lines in a way that should be obvious to one skilled in the art.

Throughout the layout, maintaining accurate relative timing between paired clock and data signals is essential for correct operation.

Figure 6:
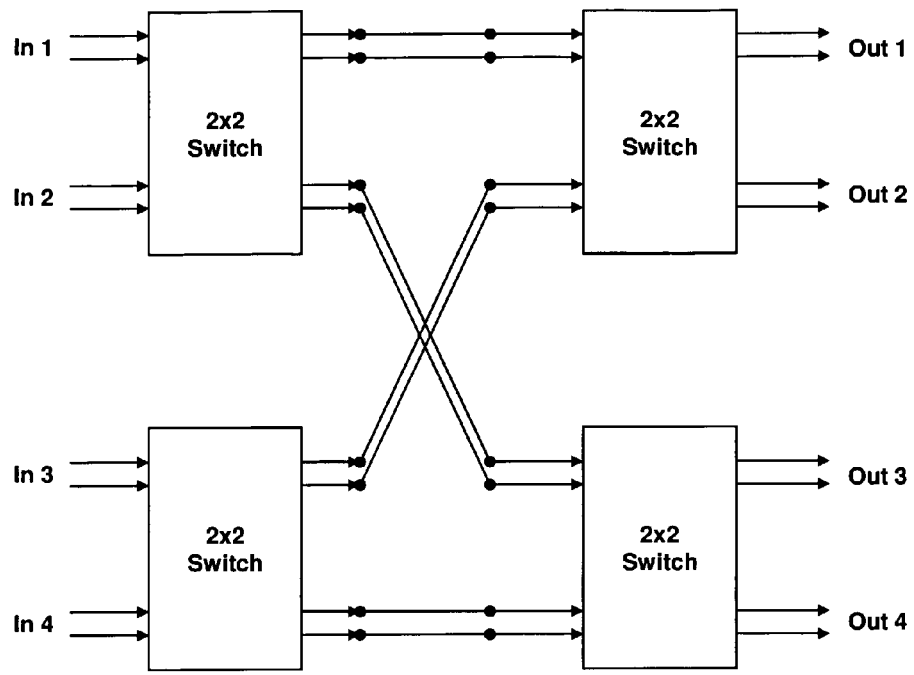
FIG. 6 is a block diagram of a 4×4 switch matrix consisting of four 2×2 building-blocks in a Banyan network.

Once a 2×2 switching network is complete, standard network approaches can be used to generate larger networks. For example, FIG. 6 shows the design of a 4×4 switch using the well-known, scalable Banyan network, with the double lines indicating routing of both data and clock signals together.

III. Architecture of Multicasting, Cross-Point Switch Matrix

Figure 8:
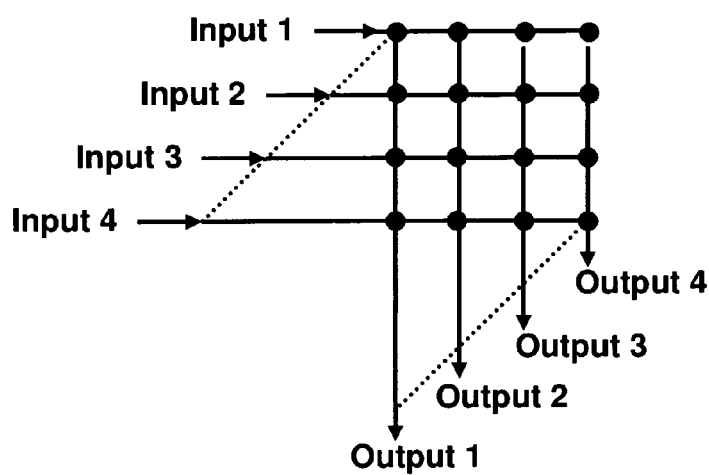
FIG. 8 shows an optional delay compensation network for a multicasting switch matrix of the type shown in FIG. 7.
Figure 7:
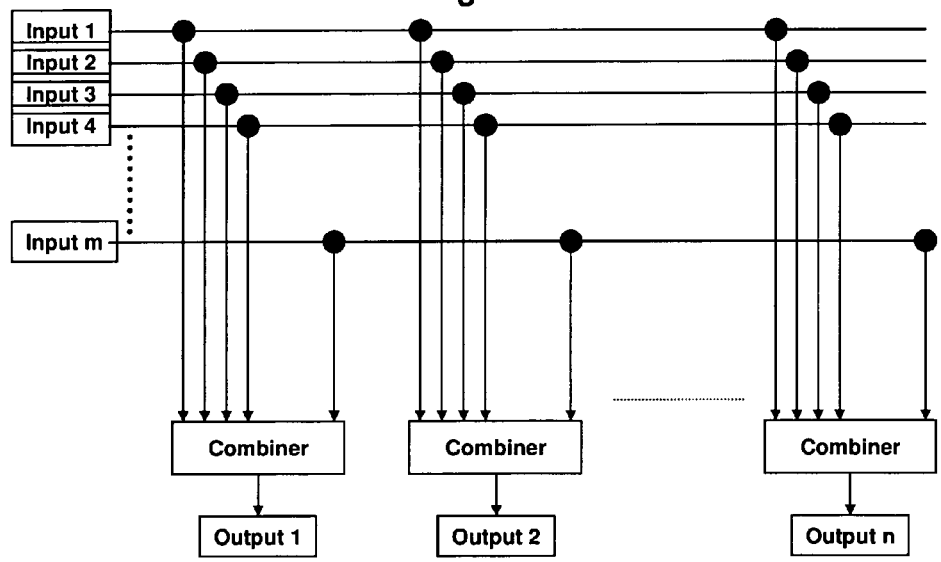
FIG. 7 shows a block diagram of a multicasting switch matrix in accordance with one aspect of the invention.

For some applications, it is necessary to copy one input to multiple outputs, or vice versa. The relevant switch architecture here is an M×N cross-point switch matrix that connects M inputs to N outputs (FIG. 7). Here each input propagates horizontally through a set of switch cells. If a switch is turned on, a copy of the input data stream is routed down the corresponding column towards an output port; there is no degradation of signal quality since digital copying is lossless. Any number of switches may be turned on in each row to produce copies of the input at multiple output ports. There is a potential problem of latency in this structure, since the signal propagation paths from an input port to different output ports is different. For most communications applications, such small differences in propagation delays (a nanosecond or less) do not matter. Delay compensation networks (shown as triangles in FIG. 8) can be added for applications, such as a network switch for multiprocessor supercomputers, that are sensitive to delay mismatches. Delay compensation can be achieved using passive lines of matched physical lengths or active transmission structures with matching delay times (such as tunable Josephson transmission lines).

We can use the same DC and NDRO switches (FIGS. 2 and 3 or the switch cell of FIG. 4) to build this multicasting switch matrix depending on whether the clock line accompanies the data line. The building block of this matrix is a row (FIGS. 9A and 9B).

The multicasting switch matrix architecture in FIG. 7 is composed of M×N switches as in FIG. 3. Each switch has a set and reset line that permits the routing to be dynamically modified. For many implementations, as suggested in FIG. 9B, the "set" lines may be connected in series, and the entire M×N array addressed by a single digital word. Given the very fast clock speed, the entire array can be reconfigured in a short time. For very large arrays, partial parallel addressing (of separate rows, for example) may be used to speed up the reprogramming rate. In this way, one may direct any input to any and all of the outputs, in a way that is rapidly reconfigurable.

IV. Integration of Switch Matrix into Transceiver System

Figure 10:
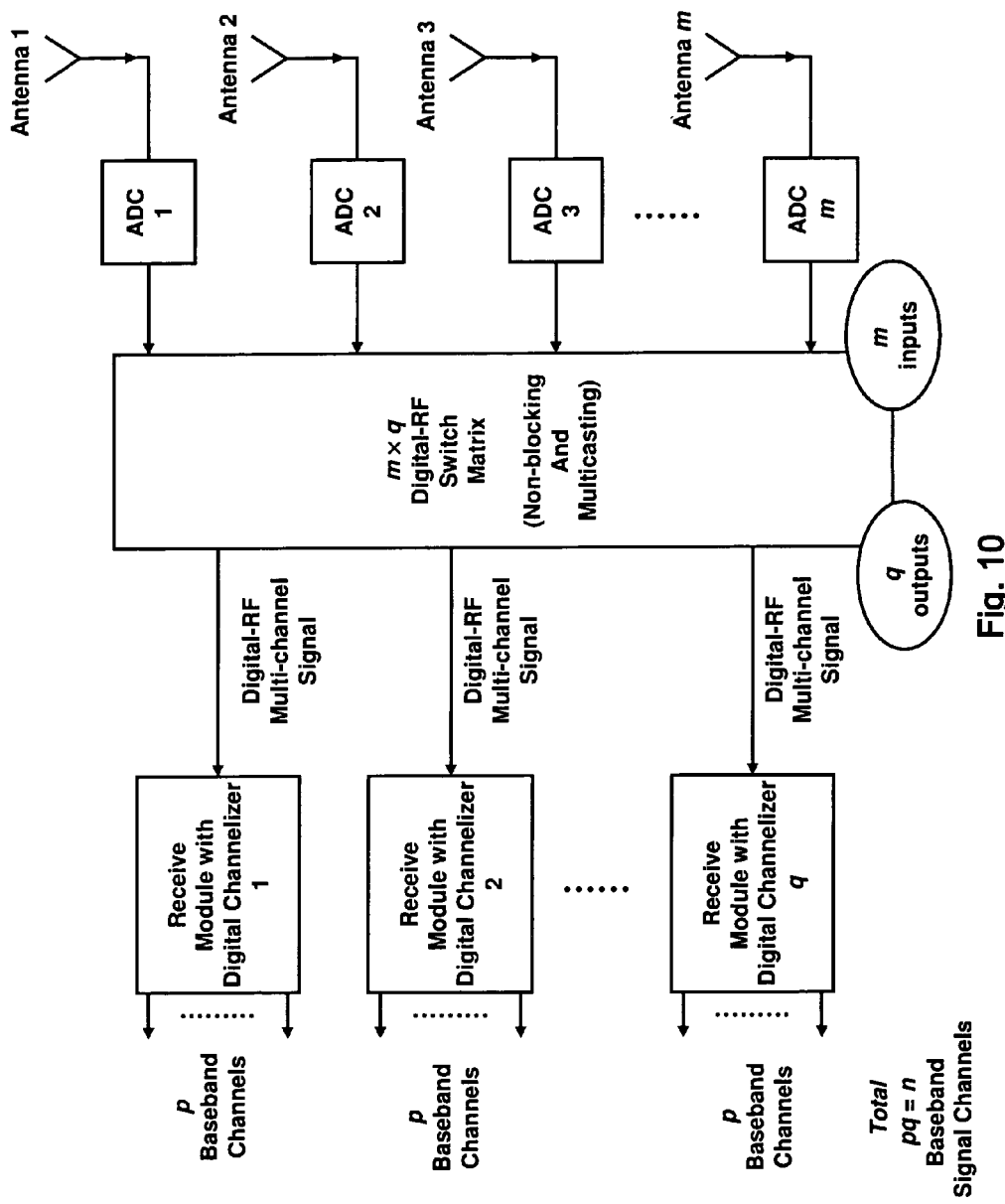
FIG. 10 is a block diagram of a digital-RF switch matrix for receiver systems showing size of the switching array.

To exemplify the advantages of digital routing of RF signals, let us examine the receive side in greater detail (FIG. 10). The analog RF input signals are digitized directly at RF using an ADC behind each antenna. Once the RF signals are in the digital domain, multiple copies can be generated without compromising signal power and quality. Therefore, the digital-RF signal can be simultaneously applied to a bank of digital channelizing units, each operating independently to extract a subband from a wide input band. For a multi-band system, digitized data streams from multiple ADC front-ends can be distributed to a bank of channelizers through a digital non-blocking, multicasting switch matrix. This architecture is scalable to an arbitrary number of channelizers (or more general digital processors) and banded antenna-ADC pairs. Furthermore, the digital switch matrix can be programmed in real time to dynamically reconfigure the communication system: changing band-to-channel allocation, cross-banding, etc.

In general, signal processing involves multiple steps, including multiple levels of channelization. For simplicity, here we have considered only the first level channelization function: extraction of a sub-band through mixing and filtering. This step requires digital-RF processing at clock speeds of 40 Gbps and beyond, and therefore, may be accomplished using superconductor electronics.

One special requirement for the switch matrix is its ability to support multiple input data rates. The ADCs may not share the same clock frequency. For example, the choice of clock frequency may depend on the center frequency of the band for convenient digital in-phase and quadrature (I & Q) mixing, which requires the clock to be 4 times higher or multiples thereof. An asynchronous or better said multi-synchronous switch, routing both the clock and digitized data together, is essential to address this requirement. This ability to distribute digital signals with several different clock frequencies simultaneously within the same general-purpose switch matrix is a unique feature of one aspect of the invention.

Figure 11:
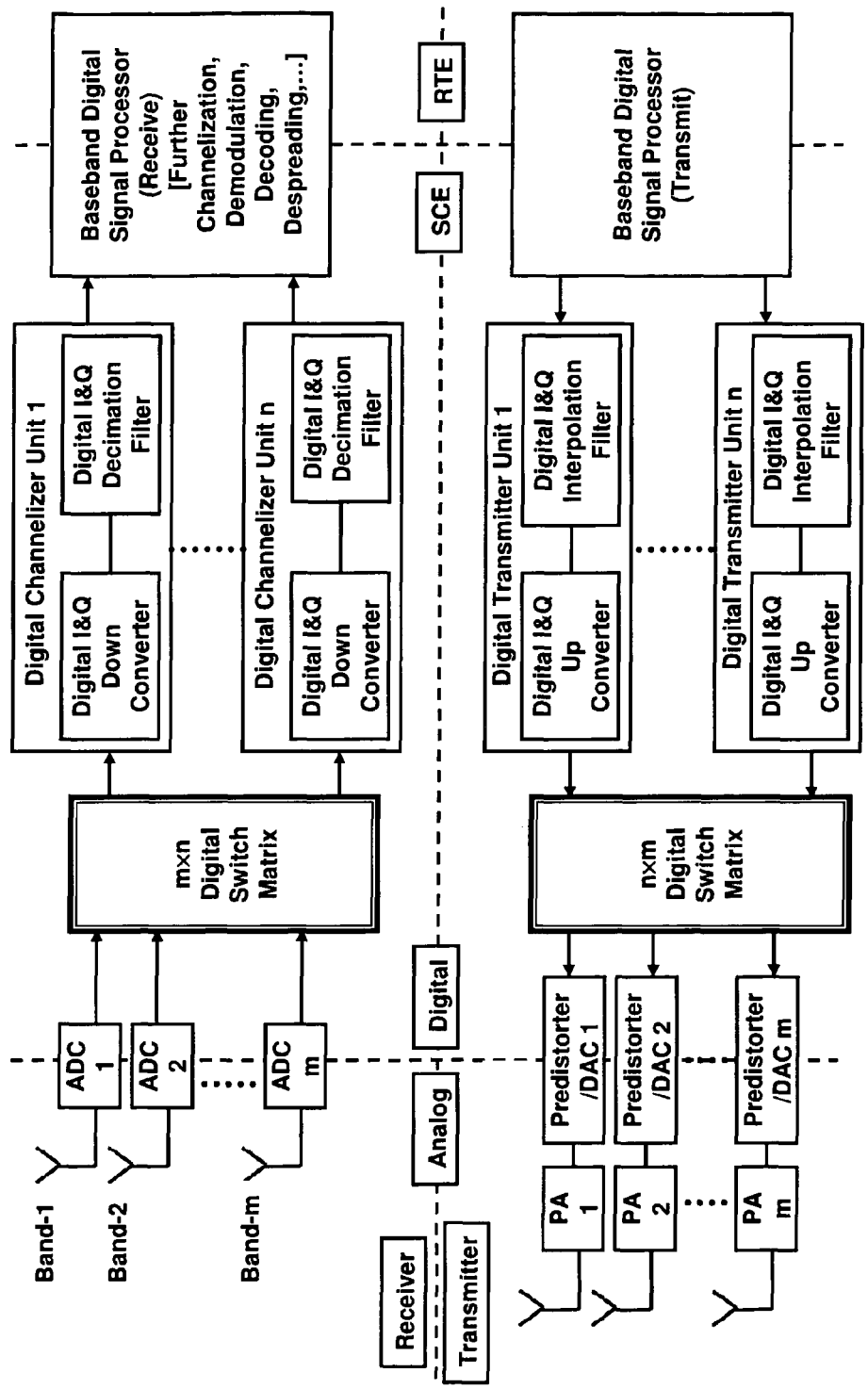
FIG. 11 shows a block diagram of a digital switch matrix included in both receiver and transmitter of a complete digital-RF transceiver system.

A general block diagram of a complete direct digital-RF communication system is shown in FIG. 11. A multi-band RF communication system consists of an antenna subsystem to capture electromagnetic energy in different RF bands and a transceiver subsystem to transmit and receive information from each RF band through a variety of signal processing steps (e.g., up/down-conversion, filtering, modulation/demodulation, coding/decoding, etc.). The goal is to dynamically assign the available signal processing resources to the input bands to meet the communication needs. This requires dynamic RF distribution and routing. The top half of FIG. 11 shows the receive side, where direct digitization of RF signals by analog-to-digital converters (ADCs) is followed by programmable digital routing to a bank of digital processing units. The bottom half shows the reciprocal transmit side. Here, multiple transmit signals are digitally synthesized and connected to digital-to-analog converters (DACs), coupled to digital-RF predistorters that linearize the RF transfer function of high power amplifiers (HPAs) directly.

A similar switch matrix may also be incorporated within a digital-RF transmitter system. In one embodiment of the invention, as indicated in the Multicasting Switch Matrix in FIG. 7, it may be desirable to direct more than one digital-RF input to be combined in the same output. Functionally, the multiple inputs may be added in a Combiner circuit, where this must be carried out in the Digital Domain in the digital-RF signals. Let us assume here that the clock frequencies of these signals to be added are the same. That is generally the case for signals designed for transmission using the same output antenna, which are within the same output band. Then the Combiner circuit can be implemented as simply a fast clocked Binary Adder, as has already been demonstrated in RSFQ technology. The outputs of the Binary Adder circuit may be passed along to a multi-bit Digital-to-Analog converter (DAC), the output of which can then be passed to an RF Power Amplifier, and then to a Transmission Antenna.

While various embodiments of the present invention have been illustrated herein in detail, it should be apparent that modifications and adaptations to those embodiments may occur to those skilled in the art without departing from the scope of the present invention as set forth in the following claims.

What is claimed is:

1. A digital radio frequency switch matrix, adapted to receive a plurality of inputs, generate a plurality of outputs, and simultaneously route a plurality of inputs to any of a plurality of outputs, comprising:

an array comprising a plurality of inputs, having a plurality of associated clocks;

a digital control input adapted to receive a signal indicative of a mapping between at least one of said inputs and at least one respective output;

a digital logic array, responsive to said digital control input for simultaneously communicating a plurality of signals each corresponding to one of the plurality of inputs and a respective associated clock to at least one of said outputs indicated by the digital control input; and an array of the outputs, each adapted to present a regenerated signal corresponding to one of the plurality of inputs and a respective associated synchronized regenerated clock maintaining accurate relative timing therebetween.

2. The digital radio frequency switch matrix according to claim 1, wherein said digital control input is adapted to receive said signal indicative of a mapping between an input and a respective output as a serialized digital sequence.

3. The digital radio frequency switch matrix according to claim 1, wherein said digital radio frequency switch matrix is adapted to simultaneously multicast a signal represented in a single input to a plurality of outputs.

4. The digital radio frequency switch matrix according to claim 1, wherein said input is routed through a set-reset flip-flop cell and said associated clock is routed through a non-destructive readout cell.

5. The digital radio frequency switch matrix according to claim 1, wherein said digital radio frequency switch matrix is configured as a Banyan network.

6. The digital radio frequency switch matrix according to claim 1, wherein said digital radio frequency switch matrix is configured as an N×M crosspoint switch matrix.

7. The digital radio frequency switch matrix according to claim 6, further comprising a delay compensation network to ensure equal delays between different pairs of respective input and respective output.

8. The digital radio frequency switch matrix according to claim 7, wherein the delay compensation is selectively tunable to achieve different delay characteristics.

9. The digital radio frequency switch matrix according to claim 1, wherein a mapping of input to output by the digital logic array is dynamically reconfigurable.

10. The digital radio frequency switch matrix according to claim 1, wherein at least one associated clock has a rate of 40 Gbps.

11. The digital radio frequency switch matrix according to claim 1, wherein the digital logic array comprises a plurality of Josephson Junctions.

12. The digital radio frequency switch matrix according to claim 1, wherein the digital logic array comprises superconducting devices.

13. The digital radio frequency switch matrix according to claim 1, wherein at least one input receives a digital data stream from an analog-to-digital converter.

14. The digital radio frequency switch matrix according to claim 1, wherein at least one output presents a digital data stream to a digital-to-analog converter.

15. The digital radio frequency switch matrix according to claim 1, wherein at least one input receives a digital data stream from a digital channelizing converter, based on a plurality of data streams assigned different channels within the data stream.

16. The digital radio frequency switch matrix according to claim 1, wherein at least one output presents a digital data stream to a digital channelizing receiver, producing a plurality of data streams assigned different channels within the data stream.

17. A digital radio frequency switching method, comprising:

receiving a plurality of inputs, having a plurality of associated clocks;

receiving a signal indicative of a mapping between at least one of said inputs and at least one respective output from a digital control input;

simultaneously communicating a plurality of signals, each corresponding to one of the plurality of inputs and a respective associated clock to at least one of said outputs indicated by the digital control input through a digital logic array; and presenting as an output a regenerated signal corresponding to one of the plurality of inputs and a respective associated synchronized regenerated clock, maintaining accurate relative timing therebetween.

18. The method according to claim 17, wherein said signal comprises a serialized digital sequence.

19. The method according to claim 17, an input signal is simultaneously multicast to a plurality of outputs.

20. The method according to claim 17, further comprising the step of ensuring equal delays though a plurality of signal paths between different pairs of respective input and respective output.

21. The method according to claim 17, further comprising the step of selectively tuning a delay within a signal path achieve different delay characteristics.

22. The method according to claim 17, further comprising the step of dynamically configuring a mapping of input to output by the digital logic array.

23. The method according to claim 17, wherein at least one input receives a digital data stream from an analog-to-digital converter or at least one output presents a digital data stream to a digital-to-analog converter.

24. The method according to claim 17, wherein at least one input receives a digital data stream from a digital channelizing converter, based on a plurality of data streams assigned different channels within the data stream or at least one output presents a digital data stream to a digital channelizing receiver, producing a plurality of data streams assigned different channels within the data stream.

* * * * *